United States Patent [19]

Fleischmann et al.

[11] Patent Number: 5,133,990

[45] Date of Patent: Jul. 28, 1992

[54] TECHNIQUE FOR MASS PRODUCTION OF CODED SURFACE ACOUSTIC WAVE DEVICES

[75] Inventors: Bernd W. Fleischmann, Munich, Fed. Rep. of Germany; Donald R. Allen, San Jose, Calif.

[73] Assignee: Crystal Technology, Inc., Palo Alto, Calif.

[21] Appl. No.: 505,338

[22] Filed: Apr. 5, 1990

[51] Int. Cl.⁵ ............................................. C23C 26/00
[52] U.S. Cl. .................................... 427/100; 428/195; 430/5
[58] Field of Search ........................... 427/100; 430/5; 428/195

[56] References Cited

U.S. PATENT DOCUMENTS

| 3,701,147 | 10/1972 | Whitehouse | 333/154 |
| 3,899,666 | 8/1975 | Bolger | 333/28 |
| 4,427,515 | 1/1984 | Yuhara | 427/100 |
| 4,595,853 | 6/1986 | Nazatsuma | 310/313 D |
| 4,679,014 | 7/1987 | Bulst | 427/100 |
| 4,682,130 | 7/1987 | Bulst | 427/100 |
| 4,686,111 | 8/1987 | Cho | 427/100 |
| 4,737,790 | 4/1988 | Skeie | 342/51 |
| 4,931,664 | 6/1990 | Knoll | 342/51 |
| 4,951,057 | 8/1990 | Nagel | 342/51 |

Primary Examiner—Shrive Beck
Assistant Examiner—Vi Duong Dang
Attorney, Agent, or Firm—Eugene S. Indyk; Joseph S. Codispoti

[57] ABSTRACT

A technique of providing numerous distinct conductive patterns on a piezoelectric substrate is accomplished using only two masking apparatus. One masking apparatus defines a common portion or structure for each of the patterns. The second masking apparatus defines numerous distinct patterns, each corresponding to a different alignment position with respect to the common structure already formed on the substrate. One application for this technique is in economic production of coded SAW devices which may serve as coding or decoding devices, filters, or correlators, each of the SAW devices having a different individual code.

9 Claims, 3 Drawing Sheets

TECHNIQUE FOR MASS PRODUCTION OF CODED SURFACE ACOUSTIC WAVE DEVICES

BACKGROUND OF THE INVENTION

This invention relates to surface acoustic wave (SAW) devices. It relates, more particularly, to an economical technique for the production of SAW devices having many distinct configurations, such as coded SAW devices.

Coding and decoding apparatus has many applications, among which are position location, aircraft identification, and communications systems. Although a variety of coding and decoding apparatus has been developed, a common drawback has been the high cost of making these devices, which has limited their application in many instances to situations where technical requirements override cost considerations. However, there are a large number of applications for these coding and decoding apparatus which would benefit if a low cost way of constructing such apparatus could be developed. For example, a low cost way to manufacture coding and decoding apparatus would greatly enlarge their application to the broad field of consumer electronics, as well as to other areas.

The use of coded SAW devices as filters and correlators has been known for some time, as described in Chapter 7, pages 307-317, of a text entitled "Surface Wave Filters" edited by Herbert Matthews copyrighted 1977 by John Wiley & Sons, Inc. Although large numbers of identical SAW devices can generally be made economically in large scale production, making coding and decoding devices requires the manufacture of small numbers of dissimilar devices because of the different codings required. For example, several thousand individual codes may be required. Making small numbers of dissimilar devices prevents the low cost manufacture normally associated with the production of SAW devices.

SUMMARY OF THE INVENTION

An object of this invention is to provide a technique for producing SAW devices using a small number of masks which determines the geometry of metallized patterns on piezoelectric substrates. The small number of masks is capable of producing individualized patterns each corresponding to a unique code.

The invention takes the form of a masking technique in which a common masking pattern is used in combination with another masking pattern defining a plurality of different configurations, each corresponding to a unique code.

According to one aspect of the invention, the common masking pattern corresponds to the common structure of a multidigit interdigital transducer. The common structure has gaps that are selectively closed by using a second masking apparatus defining multiple regions, each of which may provide a structure which may be added to the common structure to form a uniquely coded transducer. The technique may be readily used with any photolithographic patterning technique such as those involving positive photoresist, negative photoresist, or lift-off patterning.

The invention is based on the recognition of the fact that different codings are due to only small changes in the overall transducer patterns. Furthermore, only a small region of a second masking apparatus is required to define these small changes. Multiple regions on the second masking apparatus may be provided so that a single second masking apparatus may provide a number of different codes.

BRIEF DESCRIPTION OF THE DRAWINGS

Features of the invention and additional objects of the invention will be more readily appreciated and better understood by reference to the following detailed description which should be considered in conjunction with the drawings.

As those skilled in the art can appreciate, FIGS. 1-5 also represent the configuration of masking apparatus which may be used in a photolithographic process of producing SAW devices. Separate drawings of the masking apparatus are not shown because they would only duplicate the information already given in FIGS. 1-5.

DETAILED DESCRIPTION

Figure 1:
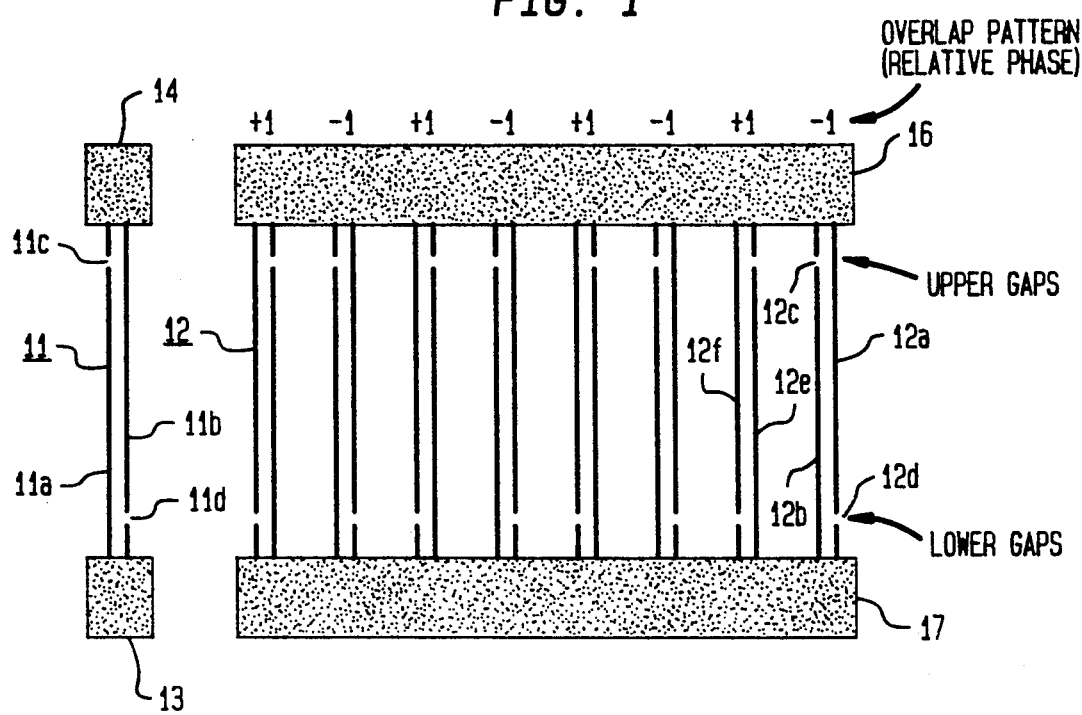
FIG. 1 depicts the metallization structure of a conventional coded SAW device.

FIG. 1 illustrates a conventional coded SAW device which may be used as a coding or decoding device, a filter, or an 8-bit correlator. The SAW device comprises a metallization pattern formed on a piezoelectric substrate by conventional photolithographic techniques. The metallization may be comprised of an alloy of chromium and aluminum, for example. Although any generally known piezoelectric materials may be used as the substrate, examples of suitable materials include quartz or lithium niobate, whose properties are well known and understood. As is known, conventional photolithographic techniques of making SAW devices include exposure of selected areas on the surface of the substrate to electromagnetic energy. This exposure of selected areas of the substrate is accomplished through the use of masking apparatus which selectively blocks the electromagnetic energy from predetermined areas of the substrate.

A transducer 11 serves as an input transducer and a transducer 12 serves as an output transducer in the SAW device of FIG. 1. An input signal is impressed between a lower conductive pad 13 and an upper conductive pad 14 of the input transducer 11 to launch a surface acoustic wave toward the output transducer 12. The acoustic wave induces an output signal in the output transducer. The transducer 12 includes eight pairs of conductive strips or fingers. The fingers in each pair overlap each other in one of two ways, designated as +1 or −1, as indicated in an overlap pattern written above an upper bus bar 16. The coding of the transducer is defined by the sequence and character of the overlap pattern, in other words, by the sequence of +1's and −1's in the overlap pattern. This particular overlap pattern provides an individual or unique code. Of course, the number of codes is related to the number of bits in the overlap pattern which can be increased to provide as many different codes as desired.

The output signal is produced between the upper bus bar 16 and a lower bus bar 17 of the output transducer. The output signal is essentially a combination of the input signal and the +1, −1 sequence defined by the overlap pattern. Specifically, the output signal is the input signal convolved with the +1, −1 sequence. In other words, successive segments of the input signal are multiplied by +1 or −1 depending on the sequence of the overlap pattern.

FIG. 1 shows that the input transducer 11 has a strip of conductive material 11a connected to a conductive pad 13 and extending toward another conductive pad 14. The input transducer 11 also has a strip of conductive material 11b connected to the conductive pad 14 and extending toward the conductive pad 13. An upper gap 11c is located between the conductive strip 11a and the conductive pad 14. A lower gap 11d is located between the conductive strip 11b and the conductive pad 13. As shown in FIG. 1, the conductive strips 11a and 11b overlap in a region defined by the vertical separation between the two gaps 11c and 11d.

The output transducer 12 has a number of conductive strips, in this example, eight conductive strips, connected to the upper bus bar 16 and extending toward the lower bus bar 17. One of those conductive strips is labeled 12a in FIG. 1. The output transducer also has a number of conductive strips, again eight conductive strips in this example, connected to the lower bus bar 17 and extending toward the upper bus bar 16. One of those conductive strips is labeled 12b in FIG. 1. A series of upper gaps, one of which labeled 12c in FIG. 1, separates the conductive strips connected to the lower bus bar 17 from the upper bus bar 16. A series of lower gaps, one of which is labeled 12d in FIG. 1, separates the conductive strips connected to the upper bus bar 16 from the lower bus bar 17.

The conductive strips between the bus bars 16 and 17 are arranged in pairs as shown in FIG. 1. Each pair of conductive strips contains one strip connected to the upper bus bar 16 and one strip connected to the lower bus bar 17. The strips in each pair overlap in one of two ways. The first kind of overlap is like that of the pair of strips 11a and 11b in the input transducer 11. An example of such an overlap is found in the pair of strips 12a and 12b, such overlap being designated as "−1" in the overlap pattern shown above the upper bus bar 16. All of the other pairs having the first kind of overlap are likewise given a "−1" designation in the overlap pattern. The second kind of overlap is illustrated in the pair of conductive strips 12e and 12f next to the pair of strips 12a and 12b. The second kind of overlap is a mirror image of the first kind of overlap and is designated "+1" in the overlap pattern above the upper bus bar 16. Each of the pairs of strips having the second kind of overlap are given a "+1" designation in the overlap pattern above the upper bus bar 16.

In the example of FIG. 1, there are eight pairs of conductive strips in the output transducer. There thus are $2^8 = 256$ possible types of output transducers due to the fact that each pair of conductive strips can take on one of two possible configurations in terms of overlap. In practice, output transducers having more pairs of conductive strips are often used, so that the number of possible configurations for the output transducer is greater.

The device shown in FIG. 1 can be used either as a coding device or as a decoding device. When it is used as a coding device, an uncoded input signal, such as a sinusoidal signal or a speech signal, is impressed across conductive pads 13 and 14 of the input transducer 11. The output signal appearing across the bus bars 16 and 17 of the output transducer 12 will be a coded output signal comprising the input signal plus a coding component defined by the configuration of the output transducer. Such coding of the input signal can be used for a variety of purposes, such as preventing unauthorized reception of the information contained in the input signal or identifying the source of the input signal.

The coded output signal across the bus bars 16 and 17 may be decoded by a device similar to the one shown in FIG. 1. The decoding device has an input transducer substantially identical to the input transducer of FIG. 1. The decoding device also has an output transducer. That output transducer, however, has a code sequence which is the reverse of the code sequence of the output transducer 12 of FIG. 1. The output signal across the bus bars of the output transducer is the original uncoded input signal, when the correctly coded input signal is applied to the input transducer.

The device of FIG. 1 can also be used as a decoding device, namely, a device which removes the coding component of a coded input signal. This is the case when the coding of the input signal is the reverse of the coding defined by the output transducer 12. This coded input signal is impressed across the conductive pads 13 and 14. The output signal across the bus bars 16 and 17 then is the uncoded input signal.

In the past, separate masking apparatus for each of the codings had to be used to make one of the SAW devices like the one shown in FIG. 1. This made it uneconomical to produce these devices. Applicants have recognized, however, that a large part of the structure in those devices is common to all of the devices. Specifically, Applicants have recognized that the finished SAW devices are composed of two parts, a common portion, which is the same for all the devices, and a coding portion, which defines the code of the device and thus differentiates the devices from one another. This recognition permits simplification of the masking apparatus and procedures used to make the SAW devices. Essentially, only two types of masking apparatus are needed, not a number of masking apparatus equal to the number of possible codings which may be produced. One masking apparatus defines the common portion of the SAW device. The other masking apparatus defines all possible coding portions that will be produced. The first masking apparatus is used to define one or more of the common portions in a desired location on a substrate. The coding portion is then added to the common portion by use of a process involving aligning the second masking apparatus with respect to the common portion so that the desired coding portion is superimposed on the common portion to form a composite structure which is a completed SAW device like the one shown in FIG. 1.

Figure 2:
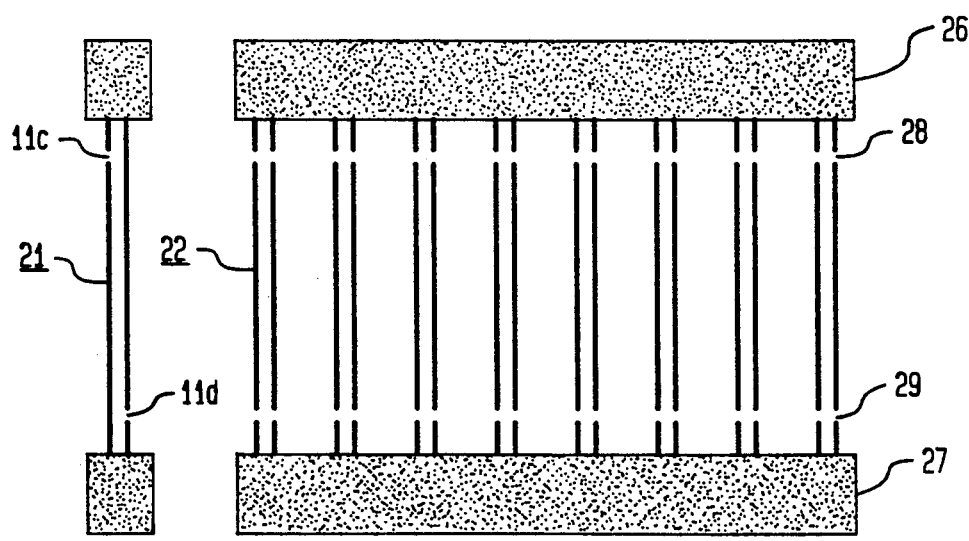
FIG. 2 illustrates a common portion of the SAW device of FIG. 1 from which a plurality different coded devices may be produced.

FIG. 2 shows the common portion of a device like the one in FIG. 1. That structure comprises a completed input transducer 21, an upper bus bar 26, a lower bus bar 27, and a row of conductive strips 22 between the bus bars. Gaps 28 and 29 separate the conductive strips from the bus bars. This structure will be part of all the SAW devices regardless of coding. Bridging selected ones of the gaps 28 and 29 with conductive gap filling structures will result in a finished SAW device having a desired coding.

Figure 3:
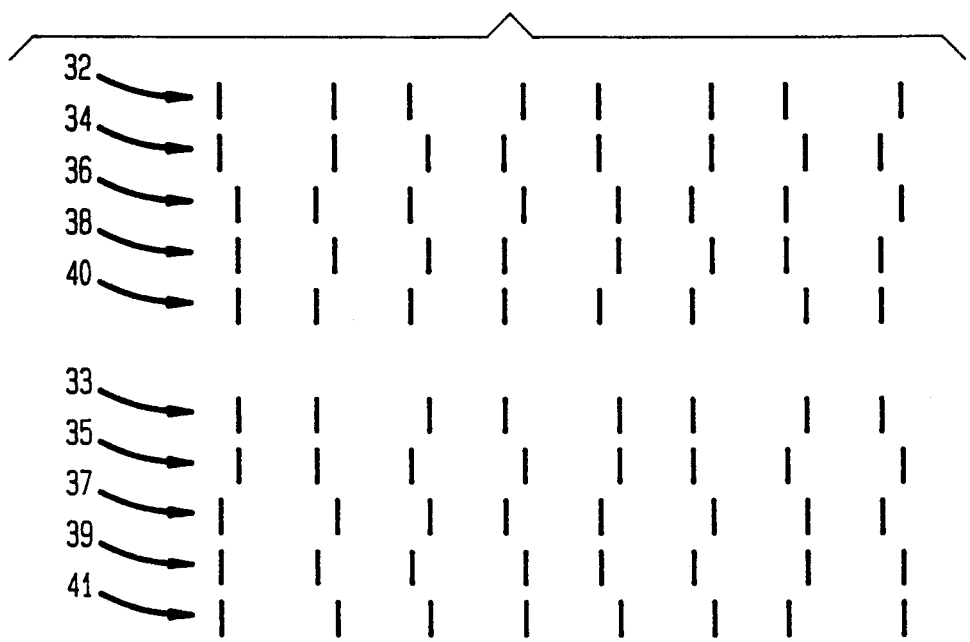
FIG. 3 illustrates a series of metallization patterns one of which may be added to the common portion of FIG. 2 to produce one of five different coded devices.

FIG. 3 represents a number of coding portions for a device like that of FIG. 1. The coding portions comprise conductive gap filling structures which may be formed on the piezoelectric substrate in predetermined locations so as to result in one of five distinct and unique codings for the common portion of the structure making up the SAW device. The gap filling structures shown in FIG. 3 thus are five coding portions which can be selectively added to the common portion of FIG. 2 so that SAW device having a desired one of the codings may be produced.

Figure 4:
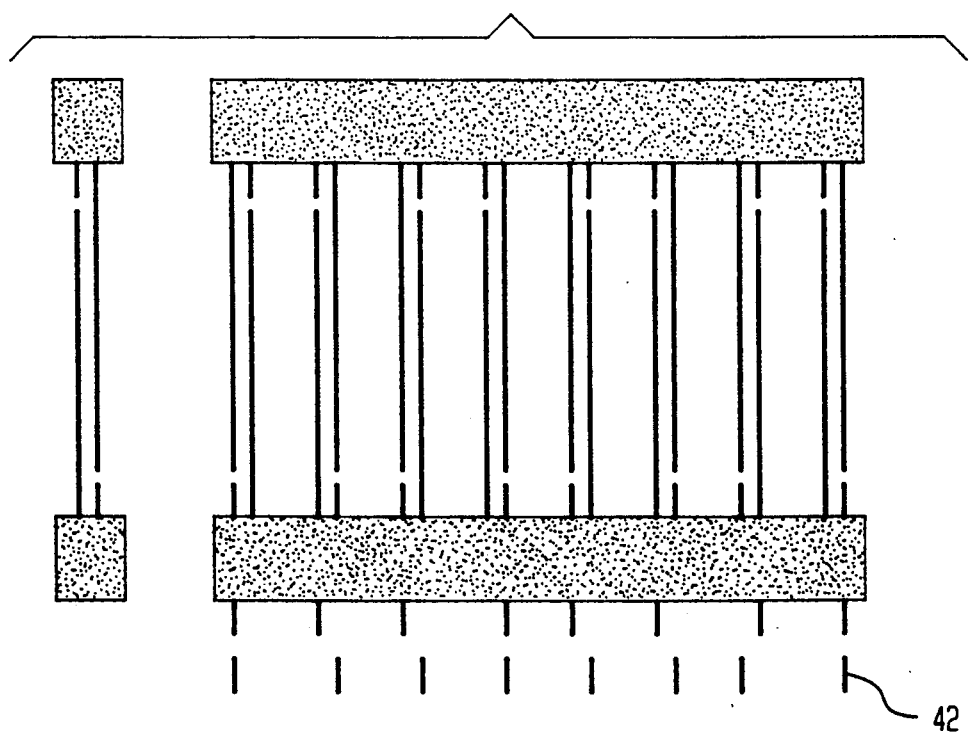
FIG. 4 is a composite of the patterns of FIGS. 2 and 3 which results in a SAW device having a selected code.
Figure 5:
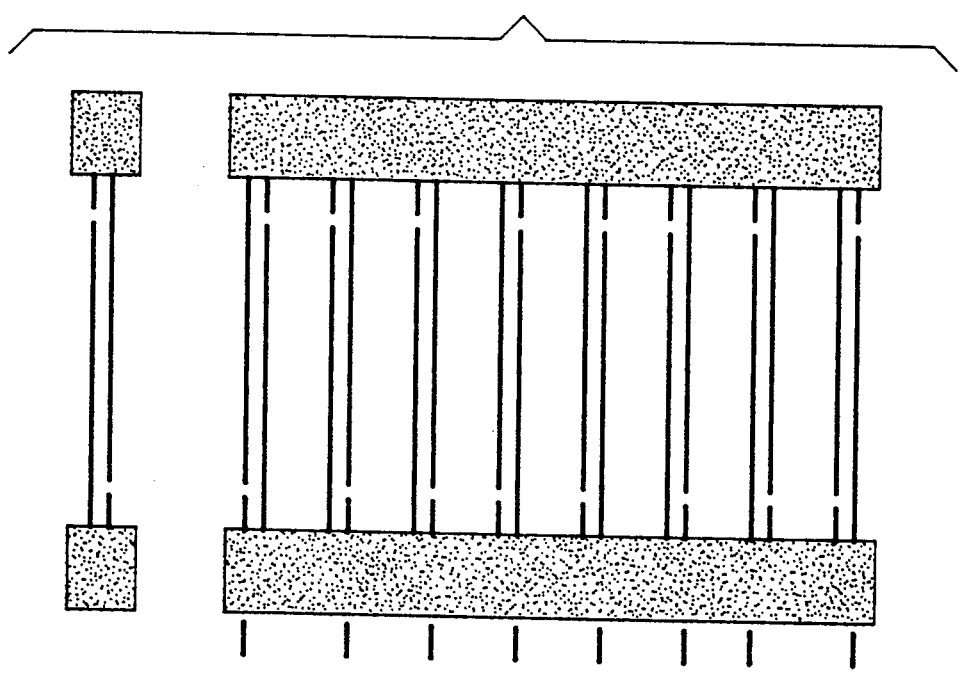
FIG. 5 is also a composite of the patterns of FIGS. 2 and 3 which results in a SAW device having a different selected code.

FIG. 3 shows ten horizontal rows of gap filling structures. Two of the rows define one of the five possible codings represented in FIG. 3. For example, the pair of rows 32 and 33 are the coding portions of the device shown in FIG. 1. The device of FIG. 1 thus can be made by forming the common portion of FIG. 2 by using a first masking apparatus which defines the configuration shown in FIG. 2. A second masking apparatus which defines the structure shown in FIG. 3 is then aligned with the structure of FIG. 2 so that the gap filling structure of rows 32 and 33 is formed on the piezoelectric substrate superimposed on the common portion so that the strips between the bus bars are selectively connected to the bus bars by the structure in rows 32 and 33. Thus a composite of the structures of FIGS. 2 and 3 is formed as shown in FIG. 4.

Although the formation of gap filling structures defined by rows other than 32 and 33 may be prevented, such as by covering those rows, there is no need to do so. The configuration of the second masking apparatus is such that the other rows of gap filling structures are formed on the existing metallization of the common structure, which has little or no effect on the performance of the device, or on electrically and acoustically inactive regions of the substrate. See, for example, reference numeral 42 in FIG. 4.

The four other codes are defined by the other pairs of rows of gap filling structure, namely, rows 34 and 35, rows 36 and 37, rows 38 and 39, and rows 40 and 41, respectively. Those codings may be applied to the common portion of FIG. 2 instead of the coding defined by rows 32 and 33 by vertically aligning the second masking apparatus so that an appropriate pair of rows fills the gaps between the conductive strips and the bus bars in FIG. 2. For example, in FIG. 5, the coding portion defined by rows 34 and 35 has been superimposed on the common portion of FIG. 2. The device of FIG. 5 thus has a coding different from the coding of the devices shown in FIGS. 1 and 4. Although only five possible coding portions are shown in FIG. 3, in practice, many additional coding portions may be defined by the masking apparatus by adding 15 more elements to the second masking apparatus defining additional rows of gap filling structures.

Both the common portion and the coding portion may be defined by the same mask, if the structures are small enough. The substrate has to be exposed sequentially through the areas defining the common and coding portions and therefore one of those areas may have to be covered when the other one is used to expose the substrate. In appropriate circumstances, the common portion may be defined by one mask and the coding portion by another mask. In other cases, multiple masks making up a first masking apparatus may be used if necessary to define the common portion. Multiple masks may also make up the second masking apparatus which defines the coding portion. This use of multiple masks for the first and second masking apparatus is needed, for example, when the structures are large enough so that they are conveniently defined by using several masks. More exposures are required but that does not change the general concept of the invention.

Although only one SAW device has been shown specifically in FIGS. 1-5 as being produced by the method of the invention, it may be the case that more than one such device is produced simultaneously by the method, for example, in a batch processing arrangement. In that situation, the masking apparatus defines multiple SAW device structures which are formed simultaneously on the substrate.

Although an example of the invention has been disclosed in the context of a single input interdigital transducer and a single output interdigital transducer, structures involving multiple input and output transducers may be readily made within the scope of the invention. The invention provides a general technique for providing very large numbers of different codes with a minimum number of masks and with convenient alignments. The technique is not restricted to specific shapes or kinds of devices. The only requirement is that there be a common portion and a coding portion in the devices.

There thus has been shown and described a novel mass production technique enabling efficient production of several codes for SAW devices, such as filters and correlators. Many changes, modifications, variations and other uses and applications of the subject invention will, however, become apparent to those skilled in the art after considering this specification and the accompanying drawings which disclose specific embodiments of the invention. For example, the system of masking patterns is not restricted to any single metallization patterning technique.

I claim:

1. Method of making one of a plurality of differently coded surface acoustic wave devices, each of the surface acoustic wave devices comprising a conductive pattern formed on a piezoelectric substrate, the conductive pattern comprising (1) a common portion having a first predetermined configuration and (2) a coding portion having a second predetermined configuration selected from a plurality of different possible coding portion configurations, the method comprising the steps of:

forming the common portion on the piezoelectric substrate by using a first masking apparatus which defines the first predetermined configuration of the common portion; and forming the selected coding portion on the piezoelectric substrate by using a second masking apparatus which defines the selected second predetermined configuration.

2. The method of claim 1, in which the common portion comprises: (1) at least one input transducer comprising first and second conductive pads and at least one conductive strip electrically connected to each of the first and second pads; and (2) at least one output transducer common portion comprising first and second bus bars and a plurality of conductive strips spaced from the bus bars;

and in which the coded portion comprises conductive elements connecting each of the plurality conductive strips to a selected one of the first and second bus bars.

3. The method of claim 1, in which the surface acoustic wave device is a filter.

4. The method of claim 1, in which the surface acoustic wave device is a correlator.

5. The method of claim 1, in which the surface acoustic wave device is a coding device.

6. The method of claim 1, in which the surface acoustic wave device is a decoding device.

7. A mask for making a surface acoustic wave device comprising a conductive pattern formed on a piezoelectric substrate, the conductive pattern comprising (1) a common portion having a first predetermined configuration and a (2) coding portion having a second predetermined configuration selected from a plurality of possible coding portion configurations, the mask comprising:

a first region defining the configuration of the common portion; and a second region defining the plurality of possible coding portion configurations.

8. The mask of claim 7, in which the first region defines at least one input transducer comprising first and second conductive pads each connected to one or more conductive strips and at least one output transducer common portion comprising first and second bus bars and a plurality of conductive strips spaced from the first and second bus bars; and in which the second region defines conductive elements which connect each of the conductive strips to a selected one of the first and second bus bars.

9. A mask set for making a surface acoustic wave device comprising a conductive pattern formed on a piezoelectric substrate, the conductive pattern comprising a common portion having a first predetermined configuration and a coding portion having a second predetermined configuration selected from a plurality of possible coding portion configurations, the mask set comprising:

a first masking apparatus defining the first predetermined configuration of the common portion; and a second masking apparatus defining the plurality of possible coding portion configurations.

* * * * *